(12) United States Patent
Hinojosa et al.

(10) Patent No.: US 11,998,112 B2
(45) Date of Patent: Jun. 4, 2024

(54) INTERNAL SIDE PANEL FOR ENCLOSURES

(71) Applicant: Hoffman Enclosures, Inc., Anoka, MN (US)

(72) Inventors: Gerardo Villegas Hinojosa, Reynosa (MX); Alejandro Usiel Hernandez Villa, Reynosa (MX); David Roque Cabello, Reynosa (MX)

(73) Assignee: Hoffman Enclosures, Inc., Anoka, MN (US)

( * ) Notice: Subject to any disclaimer, the term of this patent is extended or adjusted under 35 U.S.C. 154(b) by 254 days.

(21) Appl. No.: 17/325,514

(22) Filed: May 20, 2021

(65) Prior Publication Data

US 2021/0361065 A1 Nov. 25, 2021

Related U.S. Application Data

(60) Provisional application No. 63/027,770, filed on May 20, 2020.

(51) Int. Cl.
| | |
|---|---|
| *H05K 7/18* | (2006.01) |
| *A47B 17/00* | (2006.01) |
| *A47B 47/00* | (2006.01) |
| *A47B 96/06* | (2006.01) |
| *H02B 1/00* | (2006.01) |
| *H05K 5/02* | (2006.01) |
| *H05K 7/14* | (2006.01) |
| *F16B 12/10* | (2006.01) |

(52) U.S. Cl.
CPC .............. *A47B 47/00* (2013.01); *A47B 96/06* (2013.01); *H05K 7/14* (2013.01); *F16B 12/10* (2013.01); *F16B 2012/106* (2013.01)

(58) Field of Classification Search
CPC ......... A47B 47/00; A47B 96/06; A47B 47/03; A47B 96/14; H05K 7/14; H05K 7/1488; H05K 7/18; H05K 7/183; F16B 12/10; F16B 2012/106; H02B 1/301; H02B 1/308; H02B 1/014
See application file for complete search history.

(56) References Cited

U.S. PATENT DOCUMENTS

| | | | | |
|---|---|---|---|---|
| 3,056,639 A | * | 10/1962 | Caminker ................ | H02B 1/30 312/351 |
| 3,833,279 A | * | 9/1974 | Mackenzie, Jr. ...... | A47B 96/14 312/263 |

(Continued)

FOREIGN PATENT DOCUMENTS

| | | |
|---|---|---|
| CN | 207368475 U | 5/2018 |
| CN | 209104572 U | 7/2019 |

(Continued)

*Primary Examiner* — Kimberley S Wright
(74) *Attorney, Agent, or Firm* — Quarles & Brady LLP

(57) ABSTRACT

Support brackets for an enclosure system can be secured to the enclosure system while the enclosure system is assembled and without removing fasteners from the enclosure system. A support bracket can include first and second slots dimensioned to engage first and second bolts that are fastened to an enclosure frame. The support bracket can further include a support flange, and a stud to engage and support a side panel. When secured to the support bracket, the side panel can provide an additional mounting surface for mounting electrical components within an enclosure.

20 Claims, 8 Drawing Sheets

(56) References Cited

U.S. PATENT DOCUMENTS

| | | | |
|---|---|---|---|
| 4,461,519 A * | 7/1984 | Hildebrandt | A47B 47/03 52/801.1 |
| 4,844,565 A * | 7/1989 | Brafford | H02B 1/308 312/111 |
| 5,292,189 A | 3/1994 | Lau et al. | |
| 5,333,950 A | 8/1994 | Zachrai | |
| 5,380,083 A | 1/1995 | Jones et al. | |
| 5,388,903 A | 2/1995 | Jones et al. | |
| 5,769,519 A | 6/1998 | Nicolai | |
| 5,938,302 A * | 8/1999 | Anderson | A47B 96/145 312/265.3 |
| 6,657,861 B2 * | 12/2003 | Irmer | H02B 1/50 312/265.5 |
| 6,955,410 B1 * | 10/2005 | Nelson | H05K 5/0021 312/352 |
| 7,718,891 B2 | 5/2010 | Adducci et al. | |
| 8,153,893 B2 | 4/2012 | McSorley et al. | |
| 8,240,785 B2 * | 8/2012 | Schell | H02B 1/36 312/265.3 |
| 9,351,427 B2 | 5/2016 | Lewis, II et al. | |
| 9,402,330 B2 | 7/2016 | Chappell et al. | |
| 9,420,727 B2 | 8/2016 | Lewis, II et al. | |
| 9,549,487 B2 | 1/2017 | Lewis, II et al. | |
| 9,949,406 B2 | 4/2018 | Lewis, II et al. | |
| 10,349,553 B2 | 7/2019 | Nguyen et al. | |
| 10,356,951 B2 | 7/2019 | Lewis, II et al. | |
| 10,512,190 B2 | 12/2019 | Anderson et al. | |
| 10,517,187 B1 * | 12/2019 | Chen | H05K 7/1427 |
| 2003/0189394 A1 * | 10/2003 | Hartel | H02B 1/32 312/265.4 |
| 2004/0007951 A1 * | 1/2004 | Holighaus | H02B 1/30 312/265.4 |
| 2008/0316703 A1 * | 12/2008 | Donowho | H05K 7/20572 361/695 |
| 2009/0147944 A1 * | 6/2009 | McSorley | H04Q 1/03 379/454 |
| 2010/0027196 A1 * | 2/2010 | Schell | H02B 1/21 361/611 |
| 2010/0308703 A1 * | 12/2010 | Schell | H02B 1/21 312/265.1 |
| 2011/0115345 A1 * | 5/2011 | Kang | H02B 1/308 312/205 |
| 2013/0160271 A1 * | 6/2013 | Krietzman | H05K 7/20745 29/428 |
| 2013/0286599 A1 | 10/2013 | Fan | |
| 2018/0098456 A1 * | 4/2018 | Schreier | H05K 7/20754 |
| 2019/0021178 A1 | 1/2019 | Zumbek | |
| 2019/0343023 A1 | 11/2019 | Lewis, II et al. | |
| 2020/0163248 A1 * | 5/2020 | Chen | H05K 7/1491 |
| 2021/0352820 A1 * | 11/2021 | Hinojosa | H05K 7/18 |

FOREIGN PATENT DOCUMENTS

| | | | |
|---|---|---|---|
| EP | 0576642 B1 | 5/1993 | |
| EP | 0572601 B1 | 10/1993 | |
| EP | 081562 B1 | 11/1998 | |
| EP | 0818070 B1 | 11/1998 | |
| EP | 0901207 B1 | 11/2002 | |
| EP | 2206421 B1 | 7/2009 | |
| EP | 2915228 A1 | 9/2015 | |
| EP | 2984716 B1 | 8/2019 | |
| FR | 3007619 A1 * | 12/2014 | H05K 5/0213 |
| WO | 9309697 A1 | 5/1993 | |
| WO | 9310691 A1 | 6/1993 | |
| WO | 9627930 A1 | 9/1996 | |
| WO | 9630978 A1 | 10/1996 | |
| WO | 0137389 A1 | 5/2001 | |
| WO | 2009058928 A1 | 5/2009 | |
| WO | 2014067630 A1 | 5/2014 | |
| WO | 2014166591 A1 | 10/2014 | |
| WO | 2017079471 A1 | 5/2017 | |

* cited by examiner

INTERNAL SIDE PANEL FOR ENCLOSURES

RELATED APPLICATIONS

This application claims priority to U.S. patent application Ser. No. 63/027,770, titled Internal Side Panel for Enclosures and filed May 20, 2020, the entirety of which is incorporated herein by reference.

BACKGROUND

Electrical equipment can be installed in enclosures that are configured to allow users to access the equipment. In some cases, it may be useful to provide additional panel space for installing electrical equipment inside the enclosure without requiring modification to aspects of the enclosure or components already mounted therein.

SUMMARY

Some embodiments of the invention provide a support bracket for an enclosure system having an enclosure frame. The support bracket includes a first slot dimensioned to engage a first bolt that is fastened to the enclosure frame, a second slot dimensioned to engage a second bolt that is fastened to the enclosure frame, a support flange, and a stud to engage and support a side panel. The side panel can provide an additional mounting surface for mounting electrical components within an enclosure.

In one embodiment, a method of installing a side panel to an enclosure system to provide a supplemental mounting surface inside the enclosure system is provided. The method includes connecting first and second adjacent enclosures or connecting an end plate to the first enclosure. The method further includes installing a bolt to secure the first and second adjacent enclosures or the end plate to the first enclosure. The method further includes sliding a support bracket onto the bolt. The method further includes attaching the side panel to the support bracket.

Some embodiments of the invention provide an enclosure system. The enclosure system can include an enclosure frame of a first enclosure, a support bracket having first and second protrusions, and first and second open ended slots configured to slidably receive a respective fastener to secure the support bracket to the enclosure frame. A first side panel can have a mounting surface and can be configured to be secured to the support bracket at a first side of the first enclosure by the first and second protrusions, with the mounting surface facing an inside of the first enclosure.

In some embodiments, an enclosure system can include a second enclosure adjacent to a first enclosure and secured to an enclosure frame at a first side of the enclosure with first and second fasteners. A support bracket can be configured to be secured to the enclosure frame by receiving the first and second fasteners in first and second open ended slots after the second enclosure is secured to the enclosure frame In some embodiments, an enclosure system can include a barrier plate between a first enclosure and a second enclosure. A support bracket can be configured to be secured to an enclosure frame after the barrier plate is connected to the first or second enclosure with first and second fasteners.

In some embodiments, an enclosure system can include a first side panel that is configured to be secured to a support bracket within a first enclosure without disconnecting a second enclosure from the first enclosure.

In some embodiments, an enclosure system can include an end plate secured to an enclosure frame at a first side of an enclosure with respective fasteners. A support bracket can be configured to be secured to the enclosure frame via the respective fasteners after the end plate is connected to the enclosure frame.

In some embodiments, an enclosure system can include a first side panel configured to be secured to a support bracket within a first enclosure without substantially loosening respective fasteners.

In some embodiments, an enclosure system can include a first side panel configured to be secured to a support bracket by first and second protrusions with the first side panel at any of a plurality of orientations. A mounting surface of the first side panel can face an inside of a first enclosure at each of the plurality of orientations.

In some embodiments, an enclosure system can include a first and second support bracket. A second side panel having a mounting surface can be configured to be secured to the second support bracket at a first side of a first enclosure. The first and second side panels can be configured as partial side panels.

In some embodiments, an enclosure system can include a support bracket that includes a support flange that extends transverse to a body of the support bracket. A first side panel can include a pair of vertical side flanges that extend away from a mounting surface of the first side panel. The vertical side flanges can include a gap to receive the support flange of the support bracket.

In some embodiments, an enclosure system can include a first side panel configured to be secured to a support bracket at a first side of a first enclosure by first and second protrusions in either of two opposite rotational orientations, with a mounting surface of the first side panel facing an inside of the first enclosure in each of the rotational orientations and a support flange of the support bracket extending into a gap of the first side panel.

In some embodiments, an enclosure system can include a plurality of support brackets configured to be secured to an enclosure frame at a first side of an enclosure. A first side panel can be configured as a full side panel that is configured to engage each of the plurality of support brackets.

In some embodiments, an enclosure system can include first and second protrusions of a support bracket formed as a pair of studs that extend from a plate portion of the support bracket. The plate portion of the support bracket can include first and second open ended slots. The pair of studs can extend through a corresponding pair of support holes formed in a first side panel to secure the first side panel with the first side panel spaced apart from the plate portion.

In some embodiments, an enclosure system can include securing a first side panel to a support bracket to provide a conductive connection between the first side panel and the support bracket.

Some embodiments of the invention provide a support bracket for an enclosure system having an enclosure frame and a side panel. The support bracket can include a bracket body extending between first and second ends and first and second slots dimensioned to engage corresponding first and second bolts that are fastened to the enclosure frame to secure the bracket body to the enclosure frame. The first and second slots can be formed in the respective first and second ends of the bracket body. A support flange cam extend between the first and second ends of the bracket body and a panel engaging member can be configured to secure the side panel to the bracket body.

In some embodiments, a support bracket can include a panel engaging member that includes a pair of studs extending from a bracket body adjacent to each of first and second slots. Each of the studs can be configured to extend through a respective opening formed in a side panel to support the side panel relative to an enclosure frame.

In some embodiments, a support bracket can include a pair of studs configured to receive a respective nut to secure a side panel relative to the support bracket.

In some embodiments, a support bracket can include first and second slots that are open in the same direction to a common edge of a bracket body.

In some embodiments, a support bracket can include a support flange and a panel engaging member that each extend toward an interior of an enclosure frame when the support bracket is secured to the enclosure frame. The panel engaging member can extend farther than the support flange away from the bracket body.

Some embodiments of the invention provide a method of installing a side panel in an enclosure system. The method can include connecting a first enclosure to an adjacent member with a bolt to form an enclosure system, the adjacent member configured as one or more of a second enclosure or an end plate. The method can also include sliding a support bracket within the first enclosure to engage a slot of the support bracket with the bolt while the first enclosure is connected to the adjacent member with the bolt. The method can also include securing a side panel to the support bracket while the first enclosure is connected to the adjacent member.

In some embodiments, a method of installing a side panel in an enclosure system can include securing the side panel to a support bracket while a first enclosure is connected to an adjacent member. Securing the side panel to the support bracket can include aligning support holes formed in the side panel to receive studs extending from the support bracket to secure and support the side panel relative to the first enclosure via the studs.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
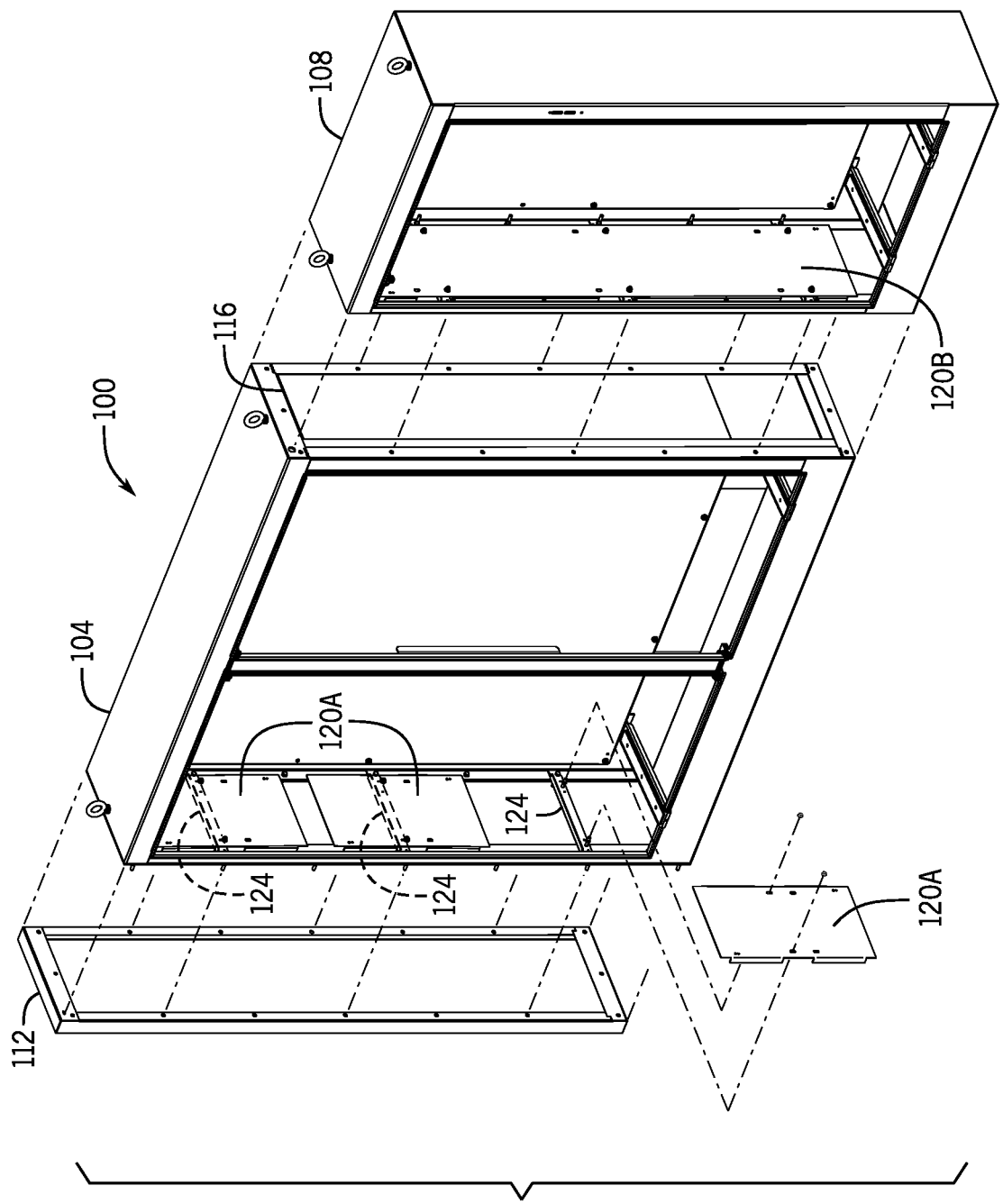
FIG. 1 is an exploded isometric view of an enclosure system that includes partial side panels and a full side panel according to an embodiment of the invention.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Likewise, the phrases "at least one of A, B, and C," "one or more of A, B, and C," and the like, are meant to indicate A, or B, or C, or any combination of A, B, and/or C.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise limited or defined, "depth" in the context of an enclosure refers to a dimension of the enclosure extending from a front side to a back side. For example, some enclosures may exhibit a total depth that can be measured from a front opening or door of the enclosure to a rear wall or rear panel of the enclosures. Similarly, "height" in the context of an enclosure refers to a dimension of the enclosure extending from a top side to a bottom side. For example, some enclosures may exhibit a total height that can be measured from a top wall of the enclosure to a floor of the enclosure. In some cases, an enclosure "depth" or "height" can vary between different parts of an enclosure. For example, some enclosure depths may be larger at top or bottom portions of the enclosure than at middle portions of the enclosure due to the inclusion of a rear panel that extends along part of a rear wall of the enclosure. In some cases, "height" or "depth" can refer to the dimension of a part of an enclosure, including, for example, a top-portion or bottom-portion height above or below a particular reference, such as the top or bottom of a center-post or other feature.

As discussed above, it can be generally useful to add additional panel space to an enclosure to provide supplementary mounting space for mounting electrical equipment. For example, an assembled enclosure, or series of assembled enclosures, may have limited or insufficient panel space for mounting sufficient electrical equipment for some installations. In particular, for ganged enclosure configurations, often only a rear panel of an enclosure is equipped to mount electrical equipment while sides of the enclosure are often either open between adjoining enclosures, separated by a barrier plate, or capped at an end of an enclosure system with an end plate. As a result, it may be useful to add additional panel space to the assembled enclosure, or series of enclosures, without substantially modifying the assembly of the enclosure, or series of enclosures.

In some embodiments, side panels and side panel assemblies configured according to the invention can address these (or other) issues. For example, in some embodiments, a side panel according to the invention can provide additional mounting surfaces or attachment points for a variety of electrical equipment. In some cases, a side panel according to the invention can be coupled to support brackets. The support brackets can be secured to an assembled enclosure with minimal adjustments to the enclosure, including without removing an associated end plate or decoupling adjacent enclosures in a ganged enclosure arrangement. For example, in some embodiments of the present invention, support brackets to support side panels can be readily installed after simply loosening several bolts, thereby allowing the enclosure to remain substantially fully assembled (e.g., not requiring adjacent enclosure frames to be disconnected) while the support brackets and side panels are installed. Further, in some embodiments, support brackets and related systems can flexibly accommodate a variety of configurations of side panels (e.g., vertically reversible, or partial-panel configurations).

FIG. 1 illustrates one example of an enclosure system 100 according to one embodiment of the invention. In the illustrated example, the enclosure system 100 includes a two-door enclosure 104 and a single-door enclosure 108 that are configured to be ganged together. As illustrated, the two-door enclosure 104 includes an end plate 112 fixed to one open end of the two-door enclosure 104 and a barrier plate 116 fixed to another open end of the two-door enclosure 104. The barrier plate 116 provides separation between interiors of the two-door enclosure 104 and the single-door enclosure 108 in the enclosure system 100.

As illustrated, the two-door enclosure 104 further includes a plurality of partial side panels 120A fixed to support brackets 124 (see, for example, FIG. 4) adjacent to the end plate 112. Each of the plurality of partial side panels 120A includes a mounting surface that faces toward an inside of the two-door enclosure 104. As illustrated in FIG. 1, the mounting surfaces of each of the plurality of partial side panels 120A are generally coplanar. Furthermore, the single-door enclosure 108 includes a full side panel 120B coupled to support brackets 124 that are secured to an open end of the single-door enclosure 108.

Although FIG. 1 illustrates the enclosure system 100 including the two-door enclosure 104 and the single-door enclosure 108, other configurations are possible. For example an enclosure system may have limitless combinations of configurations of single or multi-door enclosures. The enclosure system may include adjacent enclosures with open ends such that one interior cavity of one enclosure is accessible from another interior of another enclosure. In other embodiments, there may be barrier plates or end plates secured at one or more ends of the enclosures. In some embodiments, only a single enclosure may be used (i.e., multiple enclosures may not be ganged together). In each case, according to the present invention, support brackets (e.g., the support brackets 124) and one or more side panels (e.g., the partial side panels 120A or the full side panel 120B) may be installed at one or more ends of one or more enclosures in the enclosure system.

Figure 2:
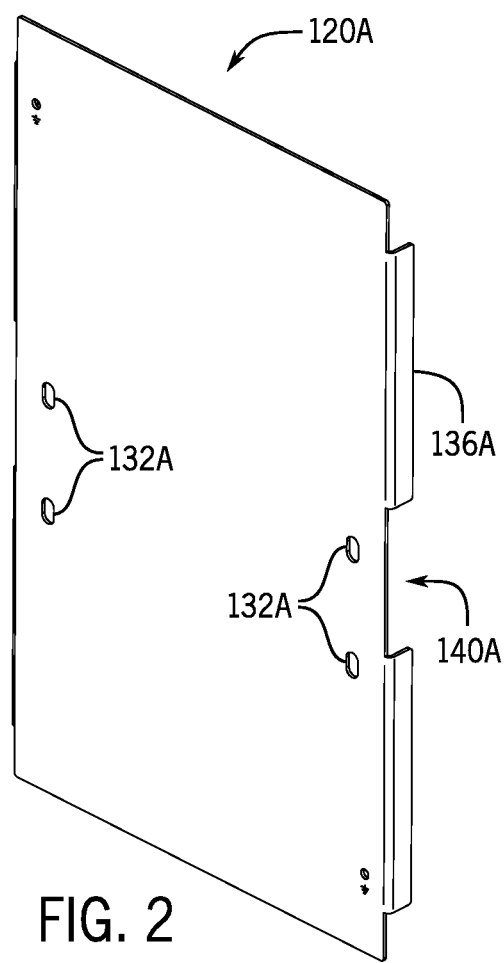
FIG. 2 is an isometric view of one partial side panel of FIG. 1 according to an embodiment of the invention.

FIG. 2 illustrates one example of the partial side panel 120A. As shown, the partial side panel 120A includes a plurality of openings configured as support holes 132A. The partial side panel 120A further includes vertical flanges 136A that extend along each vertical side of the partial side panel 120A (only one vertical side is visible in FIG. 2). The vertical flanges 136A include a notch 140A that is dimensioned to facilitate the support bracket 124 providing support to the partial side panel 120A, as will be described in detail below with reference to FIG. 6. In the illustrated embodiment, the support holes 132A are located adjacent to each vertical side of the partial side panel 120A and spaced along each vertical side similar to the length of the notch 140A, although other configurations are possible, including configurations with different numbers, sizes, or other arrangements of support holes.

In some embodiments, the partial side panel 120A is configured for use with an enclosure having a depth of 24 inches; however, a partial side panel similar to the partial side panel 120A of the illustrated embodiment may be dimensioned to fit a variety of enclosure depths. Further, in some embodiments, the partial side panel 120A may be formed from 12 ga galvanized steel; however, other configurations are possible. For example, a partial side panel may be formed from one or more of iron, steel, etc. In some embodiments, a conductive connection may be formed between the partial side panel and a support bracket.

Figure 3:
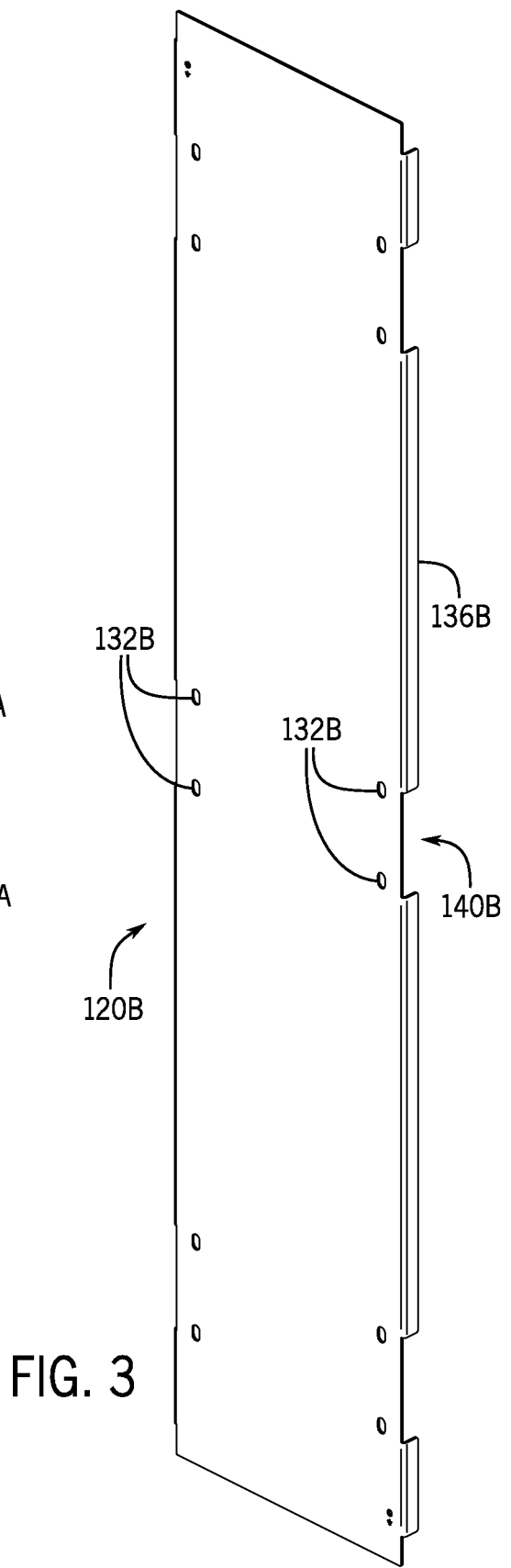
FIG. 3 is an isometric view of the full side panel of FIG. 1 according to an embodiment of the invention.

FIG. 3 illustrates one example of the full side panel 120B, which is generally comparable to the partial side panel 120A. Similar to the partial side panel 120A, the full side panel 120B includes a plurality of openings configured as support holes 132B. The full side panel 120B similarly includes vertical flanges 136B that extend along each vertical side of the full side panel 120B. The vertical flanges 136B include notches 140B that are dimensioned to facilitate the support bracket 124 providing support to the full side panel 120B. Similar to the partial side panel 120B, the support holes 132B of the full side panel 120B are located adjacent to each vertical side and spaced at a distance similar to the length of the notches 140B, although other configurations are possible, including configurations with different numbers, sizes, or other arrangements of support holes.

The vertical flanges 136B includes gaps (i.e., breaks in continuity), configured in the illustrated example as rectangular notches 140B that are dimensioned to provide clearance or support between the full side panel 120B and the support brackets 124. Similar to the partial side panel 120A, the support holes 132B of the full side panel 120B are located adjacent to each vertical side and spaced similarly to the notches 140B.

Like the partial side panel 120A, the full side panel 120B is configured for use with an enclosure having a depth of 24 inches according to some embodiments of the invention. However, other configurations are possible. For example, a full side panel may be dimensioned to accommodate a variety of enclosure depths. Further, like the partial side panel 120A described above, the full side panel 120B may be formed from a variety of materials, such as, for example, 12 ga galvanized steel.

Figure 4:
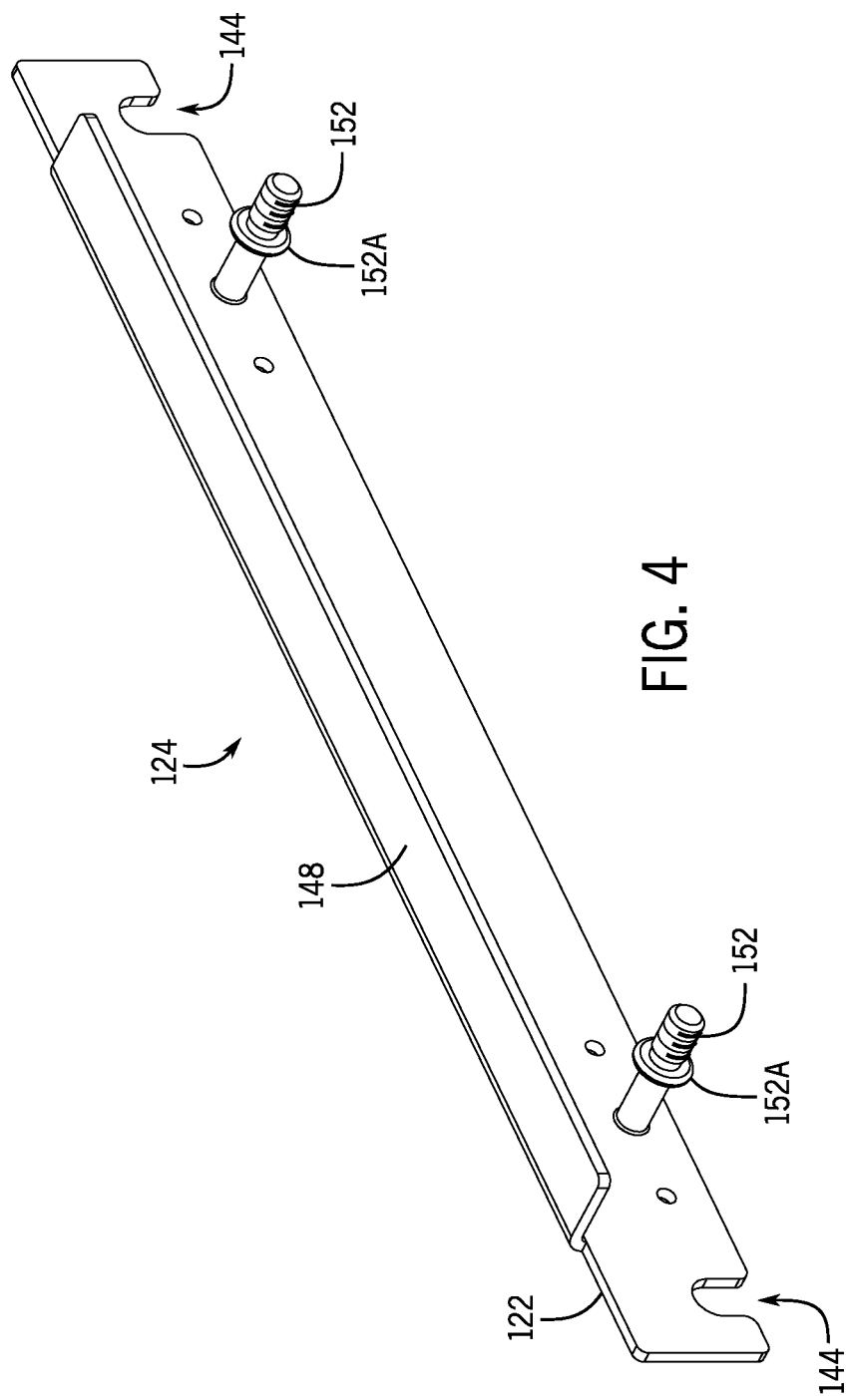
FIG. 4 is an isometric view of a support bracket according to an embodiment of the invention.

FIG. 4 illustrates the support bracket 124 according to an embodiment of the invention. The support bracket 124 includes a support plate 122 with slots 144, a support flange 148, and studs 152. The slots 144 are shown as generally U-shaped, formed in opposing ends of a body of the support bracket 124, and open in the same direction to a common edge of the support bracket 124. However, other shapes (e.g., V-shaped) and orientations (e.g., opening in perpendicular directions) are also possible in some cases. The support flange 148 extends transverse to the body of the support bracket 124 and, in use, extends toward the interior of an enclosure that it is mounted thereon. In the illustrated example, the flange extends in the lateral direction over a longer distance than the spacing between the studs 152, but a smaller distance than the spacing between the slots 144. This configuration can optimally balance visibility for easy installation with adaptability and load-bearing strength, although other configurations are possible. Further, some embodiments may include no support flange, a discontinuous support flange, or other equivalent support features.

The studs 152 are dimensioned to extend at least partially through the support holes 132A, 132B on either of the partial side panel 120A or the full side panel 120B. In the illustrated example, the studs 152 extend from the support plate 122 in parallel with the support flange 148, but a larger distance from the support plate 122 than the flange 148. Further, integrally formed collars 152A on the studs are also aligned, by the studs 152, to be farther from the support plate than is the free edge of the flange 148. Accordingly as further discussed below, a side panel supported by the studs 152 can be maintained with an appropriate spacing from the bracket 124, the associated side wall of an enclosure, etc. Further, in the illustrated example, each of the studs 152 is adjacent to an associated one of the slots 144, i.e., spaced from the associated slot 144 by 20-25% or less (e.g., 15%) of a total length of the bracket 124 between the two slots 144. Accordingly, appropriate strength of the support plate between the studs 152 and the associated slots 144 can be maintained, along with easy and separate visibility of the studs 152 and the slots 144, and optimal reduction of potential moments from in-situ loading of the studs 152.

In the illustrated embodiment, the support bracket 124 includes the studs 152 that can engage a side panel and, in particular, the studs 152 include threaded ends (as further discussed below). However, other configurations are possible. For example, in some embodiments, a support bracket may include other side panel engagement features, including recesses, non-threaded studs, non-stud protrusions (e.g., hooks), and so on. In some embodiments, a support bracket may include a DIN rail and a side panel may have engagement features, such as protrusions that are dimensioned to engage the rail (or vice versa).

In general, enclosure systems, such as the enclosure system 100 in FIG. 1, include a plurality of bolts. Specifically, enclosure systems use bolts to secure enclosure frames of adjacent enclosures to one another. Additionally, enclosure systems use bolts to secure end plates and barrier plates to enclosures, such as the end plate 112 to the two-door enclosure 104 in FIG. 1, for example.

Figure 5:
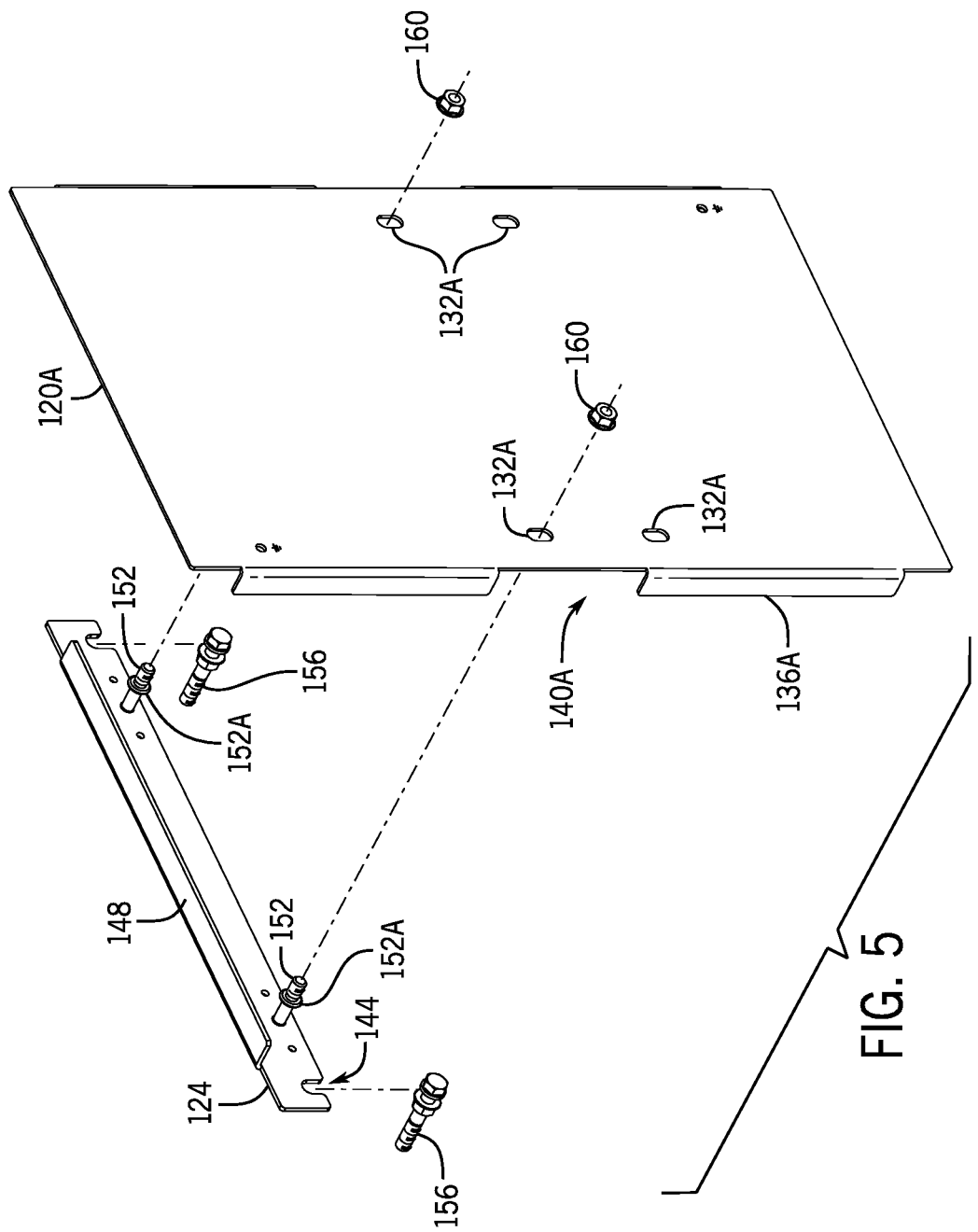
FIG. 5 is an exploded view of the partial side panel of FIG. 2, the support bracket of FIG. 4, and certain other enclosure components according to an embodiment of the invention.

Referring now to FIG. 5, a bolt 156 for securing adjacent enclosures, end plates, and barrier plates is illustrated in isolation from an enclosure. As shown, the slots 144 are dimensioned to engage the bolt 156, thereby, in use, securing the support bracket 124 to a frame of an enclosure. In particular, as also discussed below, the open ends of the slots 144 can be aligned to receive respective bolts 156 via a single downward movement of the support bracket 124, without requiring the bolts 156 to be removed or even substantially loosened (i.e., loosed by more than the thickness of the support plate 122 and a required additional clearance for sliding insertion of the support plate 122).

Figure 6:
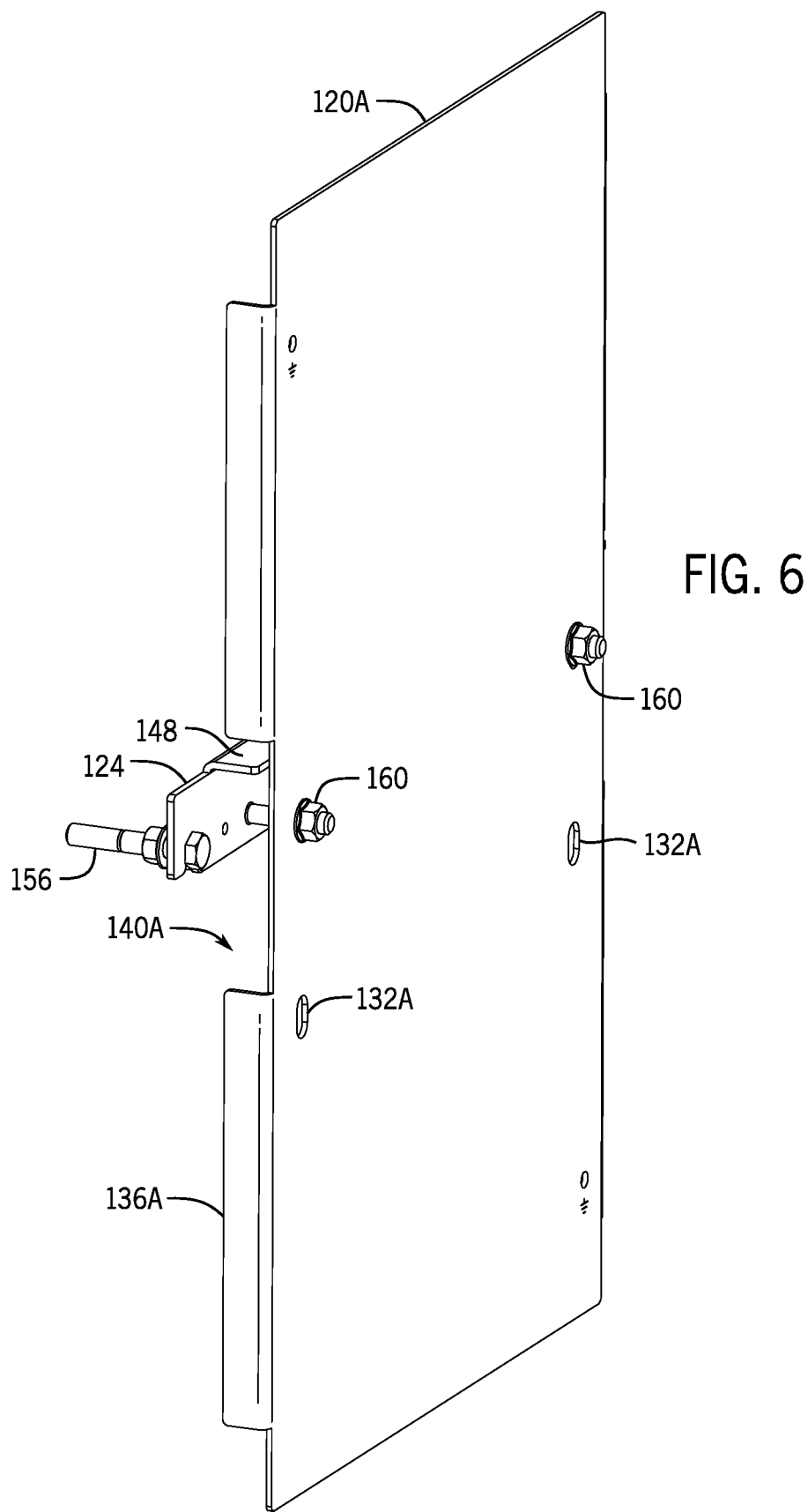
FIG. 6 is an assembled view of the partial side panel, the support bracket, and the other components of FIG. 5 according to an embodiment of the invention.

As further illustrated in FIGS. 5 and 6, support holes 132A are dimensioned to receive the studs 152, with threaded ends of the studs 152 extending through the support holes 132A when the body of the side panel 120A abuts the collars 152A. Accordingly, hex nuts 160 or other threaded fasteners may be used to secure a side panel, such as the partial side panel 120A, to the support bracket 124. In some embodiments, the hex nuts 160 may be configured as flanged hex nuts or as other known nut-type fasteners. In additional embodiments, the hex nuts 160 can be configured as serrated nuts to provide a locking action to secure a side panel relative to the stud 152 or to provide grounding connections. Notably, because of the rigid support provided by the studs 152 (or other similar protrusions), once the side panel 120A is received onto the studs 152, operators may be able to attach the hex nuts 160 (or other fasteners) to secure the side panel 120A in place without simultaneously also supporting the weight of the side panel 120A.

As briefly described above, in some embodiments, the vertical flanges 136A, 136B on the partial side panel 120A and the full side panel 120B, respectively, can provide support for each of the side panels 120A, 120B. In some embodiments, the flanges 136A, 136B can engage the support flange 148 of the support bracket 124. The support provided by the support flange 148 of the support bracket 124 can at least partially alleviate the force applied to the studs 152 when a barrier panel, such as the partial side panel 120A or the full side panel 120B, is installed on the support bracket, thus generally increasing the load rating of the side panels 120A, 120B. In some embodiments, however, a side panel can be secured to a support bracket without being vertically supported by a flange of the support bracket.

Further exemplified in FIG. 6, the vertical spacing of the support holes 132A, 132B on each of the side panels 120A, 120B, respectively, allows the side panels 120A, 120B to be installed at a plurality of orientations (e.g., at varying heights). In particular, each of the side panels 120A, 120B, which have a main body, may be rotated effectively 180 degrees within the plane of the main body, thereby engaging the respective support holes 132A, 132B on the opposing side of the respective notch 140A, 140B. In other words, the partial side panel 120A of FIG. 6 may be rotated 180 degrees, to an opposite, in-plane rotational orientation, such that the unused support holes 132A may instead receive the studs 152, thereby adjusting the height of the partial side panel 120A relative to an enclosure. In other embodiments, other arrangements of holes can provide similar customizability, including with arrangements that allow more than two mounting configurations for a given panel.

Figure 7:
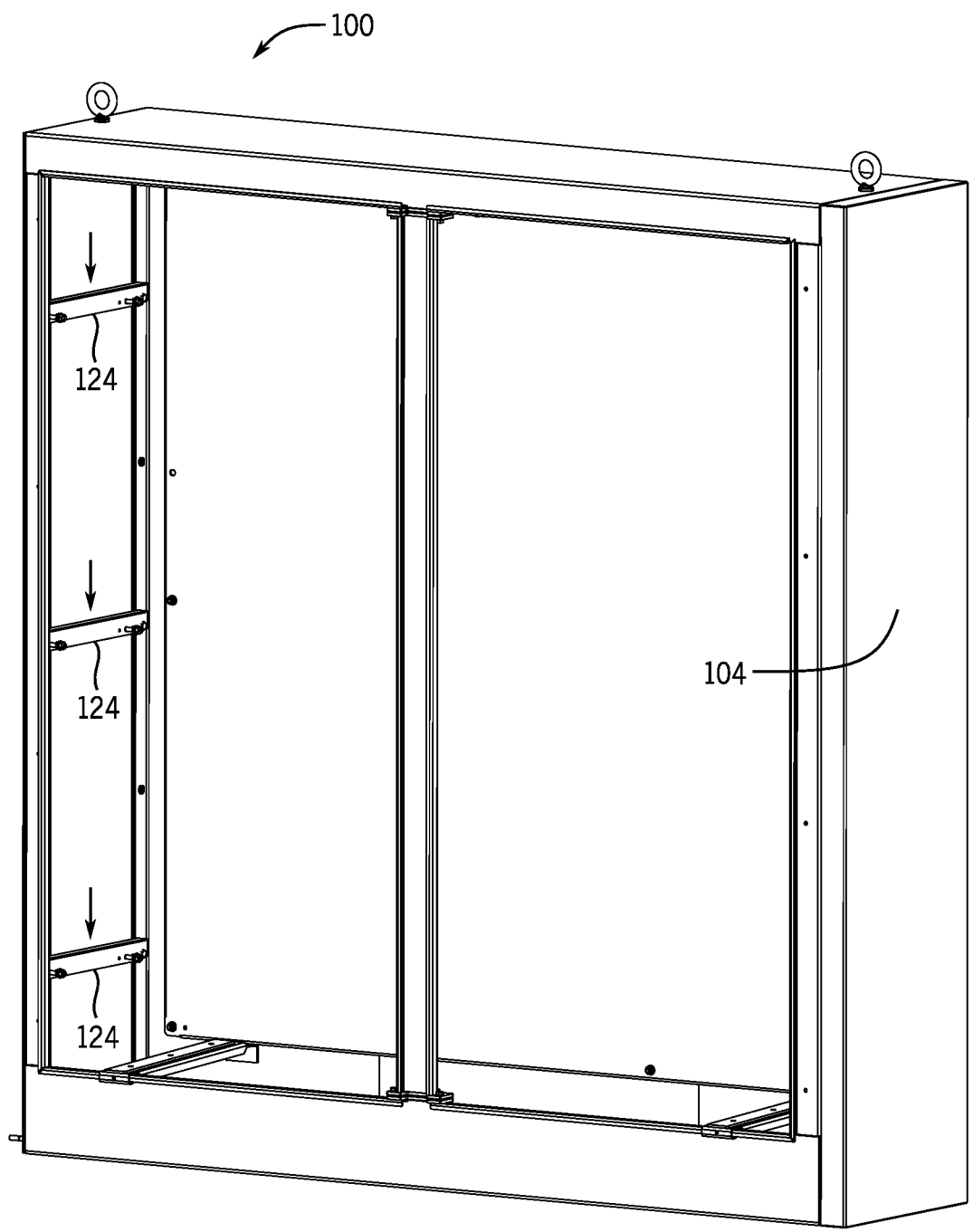
FIG. 7 is a partial view of the enclosure system of FIG. 1 indicating a direction of installation of the support brackets according to an embodiment of the invention.
Figure 8:
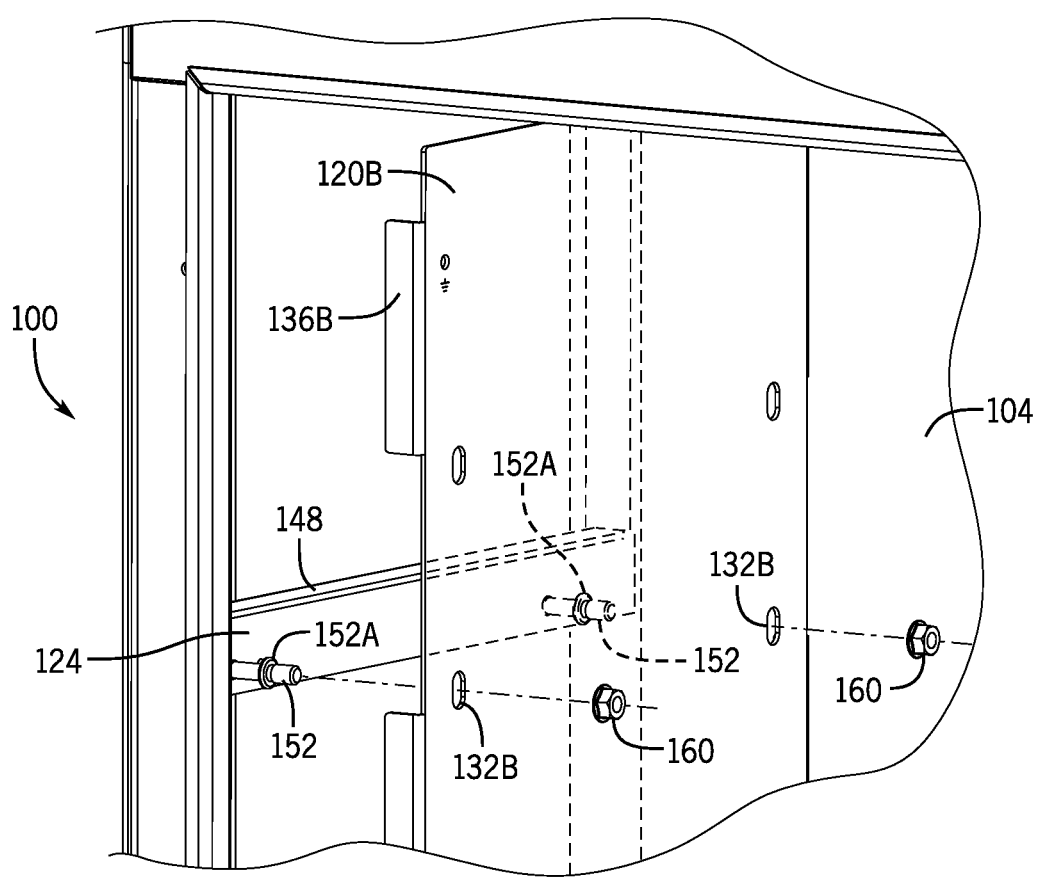
FIG. 8 is an exploded partial view of the enclosure system of FIG. 1 and the full side panel of FIG. 3 according to one embodiment of the invention.
Figure 9:
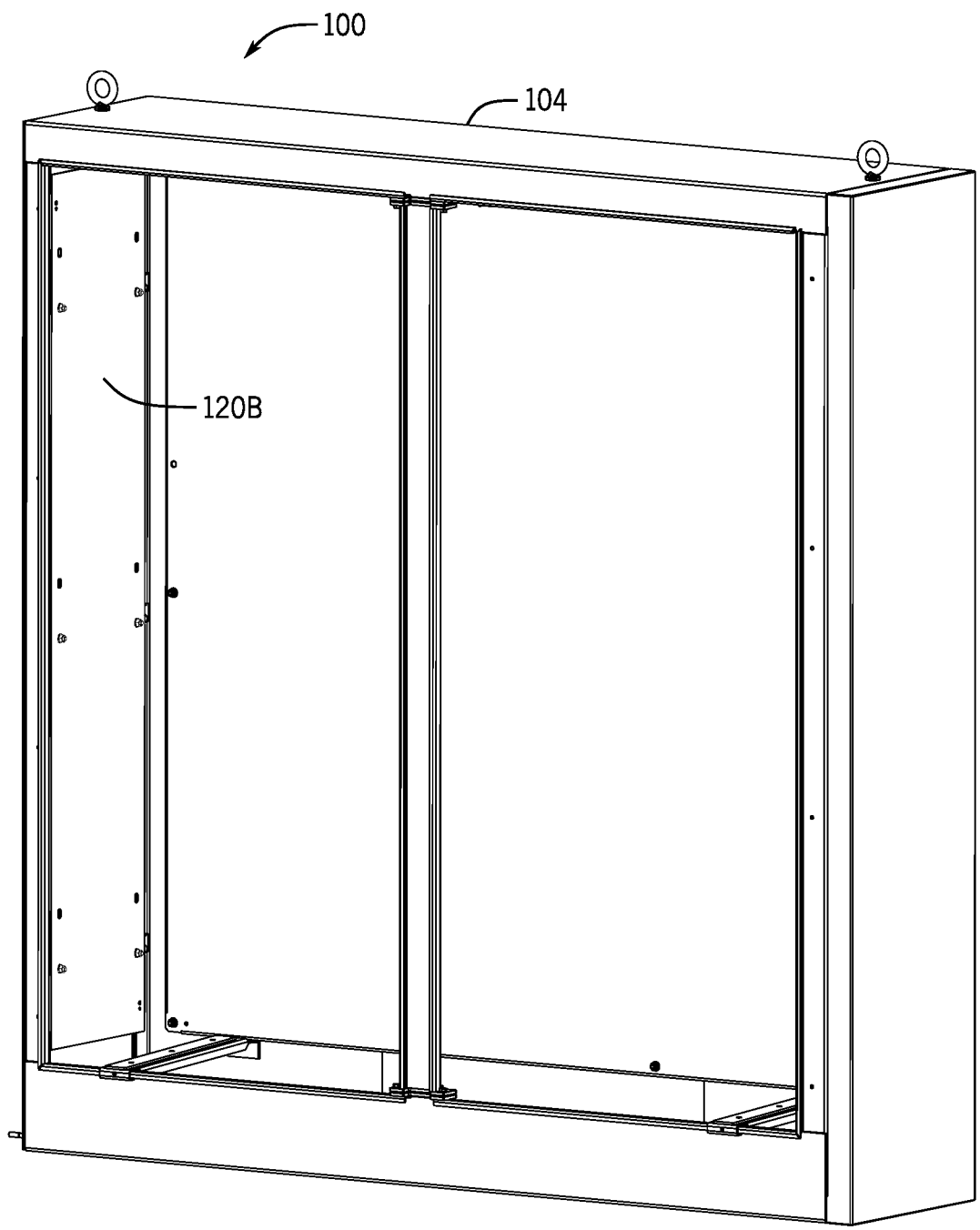
FIG. 9 is a partial view of the enclosure system of FIG. 1 with the full side panel of FIG. 3 installed on an open end of an enclosure according to an embodiment of the invention.

As illustrated in FIGS. 7-9, the enclosures system 100 can be fully constructed before the addition of the support brackets 124. FIG. 7 illustrates a partial view of the two-door cabinet 104 with an open end, i.e., without the end plate 112 shown in FIG. 1. However, it should be understood that the same installation method described below could apply if the end plate 112 were to be installed on the two-door enclosure 104. Further, similar approaches can be used to secure a side panel to a side of an enclosure that is adjacent to another enclosure (e.g., that includes a barrier panel rather than an end plate).

During installation of the support brackets 124 to the enclosure system 100, the bolts 156 (see FIG. 5), which can secure adjacent enclosures, end plates, and barrier plates, may be loosened. However, because relatively little clearance may be needed to engage the support panels 120A, 120B with the bolts 156, the bolts 156 may not need to be substantially loosened. In some embodiments, the bolts 156 may be sufficiently loosened, for example, by a quarter turn or a half turn. Notably, this may help users avoid the need to disconnect and then reposition and reconnect end walls or adjacent enclosures in order to add or remove a side panel.

Once the bolts 156 have been appropriately loosened (e.g., but not removed), the support bracket 124 may be slid downward, as indicated by the arrows in FIG. 7, such that the slots 144 engage the loosened bolts 156. The bolts 156 may then be re-tightened to secure the support bracket 124 to a frame of the enclosure system 100.

During installation, once the support brackets 124 are secured to the enclosure system 100, a side panel, or any number of mounting accessories, may be secured to the support brackets 124. (Or, in some cases, a side panel can be secured to the support brackets 124 before the support brackets 124 are installed in an enclosure.) In the example shown in FIGS. 8 and 9, the full side panel 120B is moved toward the support brackets 124 within the assembled enclosure such that the studs 152 extend through the support holes 132B. The hex nuts 160 may then be secured to the studs 152, thereby securing the full side panel 120B to the enclosure system 100. In other examples, several partial side panels, such as the partial side panels 120A (see, e.g., FIG. 1), may be secured to the support brackets 124.

In some embodiments, the support brackets 124 may be used to directly secure additional electrical components, such as a fan, for example, without necessarily also supporting a side panel. In this way, for example, some support brackets according to the invention can allow for easy customization of enclosure configurations, whether by accommodating the use of side panels or otherwise.

In general, the support brackets and side panels according to the present invention may be installed within an interior of an enclosure and therefore may not require certain waterproof, dustproof, etc. ratings as set forth by the National Electrical Manufacturers Association (NEMA). In this regard, the ability to attach the side panels without drilling additional holes through side walls of the enclosure may be particularly beneficial. Embodiments of the invention can allow for faster and simpler installation of a side panel that provides an additional mounting surface. For example, partial or full side panels can be installed in an assembled enclosure or enclosure system without structural disassembly of the enclosure or enclosure system.

Many aspects of the embodiments discussed above can be altered while still providing similar benefits for increasing mounting capabilities within an enclosure. For example, side panels in some embodiments can have more or less support holes than shown in the illustrated embodiments to increase or decrease adjustability and customizability of the height of the side panel and mounting surfaces.

Thus, embodiments of the disclosure provide for improved mounting capabilities within an enclosure. The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. An enclosure system, the enclosure system comprising:
an enclosure frame of a first enclosure;
exterior walls that surround an interior area of the first enclosure, the exterior walls including a first wall at a first side of the first enclosure;
a support bracket having first and second protrusions, and first and second open ended slots that slidably receive a respective fastener to secure the support bracket to the enclosure frame at the first side of the first enclosure, with the first and second protrusions extending toward the interior area of the first enclosure; and
a first side panel having a mounting surface that is configured to support electronics and is secured to the support bracket at the first side of the first enclosure by the first and second protrusions, with the first side panel on an opposite side of the support bracket from the first wall and with the mounting surface facing the interior area of the first enclosure.

2. The enclosure system of claim 1, further comprising a second enclosure adjacent to the first enclosure and secured to the enclosure frame at the first side of the first enclosure with first and second fasteners, the support bracket configured to be secured to the enclosure frame by receiving the first and second fasteners in the first and second open ended slots after the second enclosure is secured to the enclosure frame.

3. The enclosure system of claim 2, wherein the first wall includes a barrier plate between the first enclosure and the second enclosure, the support bracket configured to be secured to the enclosure frame after the barrier plate is connected to the enclosure frame of the first enclosure or an enclosure frame of the second enclosure with the first and second fasteners.

4. The enclosure system of claim 2, wherein the first side panel is configured to be secured to the support bracket within the first enclosure without disconnecting the second enclosure.

5. The enclosure system of claim 1, wherein the first wall includes an end plate secured to the enclosure frame at the first side of the first enclosure with the respective fasteners, the support bracket configured to be secured to the enclosure frame via the respective fasteners after the end plate is connected to the enclosure frame.

6. The enclosure system of claim 5, wherein the first side panel is configured to be secured to the support bracket within the first enclosure without substantially loosening the respective fasteners.

7. The enclosure system of claim 1, wherein the first side panel is configured to be secured to the support bracket by the first and second protrusions with the first side panel at any of a plurality of orientations, the mounting surface of the first side panel facing the interior area of the first enclosure at each of the plurality of orientations.

8. The enclosure system of claim 1, further comprising:
a second support bracket that is a second instance of the support bracket of claim 1; and
a second side panel having a mounting surface that is configured to support electronics and is secured to the second support bracket at the first side of the first enclosure, with the second side panel on an opposite side of the second support bracket from the first wall and with the mounting surface facing the interior area of the first enclosure, wherein the first and second side panels are configured as partial side panels.

9. The enclosure system of claim 1, wherein the support bracket includes a support flange that extends transverse to a body of the support bracket; and
wherein the first side panel includes a pair of vertical side flanges that extend away from the mounting surface, with a gap along each of the vertical side flanges to receive the support flange of the support bracket.

10. The enclosure system of claim 9, wherein the first side panel is configured to be secured to the support bracket at the first side of the first enclosure by the first and second protrusions in either of two opposite rotational orientations, with the mounting surface facing the interior area of the first enclosure in each of the rotational orientations and the support flange extending into the gap.

11. The enclosure system of claim 1, wherein the support bracket is one of a plurality of support brackets configured to be secured to the enclosure frame at the first side of the first enclosure, and
wherein the first side panel is configured as a full side panel that engages each of the plurality of support brackets.

12. The enclosure system of claim 1, wherein the first and second protrusions of the support bracket are formed as a pair of studs that extend from a plate portion of the support bracket that includes the first and second open ended slots, and extend through a corresponding pair of support holes formed in the first side panel, to secure the first side panel with the first side panel spaced apart from the plate portion.

13. The enclosure system of claim 1, wherein securing the first side panel to the support bracket provides a conductive connection between the first side panel and the support bracket.

14. An enclosure system, comprising:
an enclosure frame;
exterior walls that surround an interior area of the enclosure frame, the exterior walls including a first wall at a first side of the enclosure system;
a support bracket, the support bracket having:
a bracket body extending between first and second ends;
first and second slots that receive corresponding first and second bolts, the first and second bolts being fastened to the enclosure frame at the first side of the enclosure system to secure the bracket body to the enclosure frame, and the first and second slots being formed, respectively, in the first and second ends of the bracket body;
a support flange extending between the first and second ends of the bracket body; and
a panel engaging member that secures a side panel to the bracket body, with the panel engaging member extending toward the interior area of the enclosure system and toward the side panel on an opposite side of the bracket body from the first wall.

15. The enclosure system of claim 14, wherein the panel engaging member includes a pair of studs extending from the bracket body, each of the studs extending through a respective opening formed in the side panel and toward the interior area of the enclosure system to support the side panel relative to the enclosure frame.

16. The enclosure system of claim 15, wherein each of the studs is configured to receive a nut to secure the side panel relative to the support bracket.

17. The enclosure system of claim 14, wherein the first and second slots are open in the same direction to a common edge of the bracket body.

18. The enclosure system of claim 14, wherein the support flange and the panel engaging member are configured to extend toward the interior area of the enclosure frame when the support bracket is secured to the enclosure frame, with the panel engaging member extending farther than the support flange away from the bracket body.

19. A method of installing a side panel in an enclosure system, the method comprising:
securing an enclosure frame of a first enclosure to an adjacent second enclosure at a first side of the first enclosure, with first and second fasteners, to form the enclosure system;
sliding a support bracket within the first enclosure, after the second enclosure is secured to the enclosure frame with the first and second fasteners, to engage first and second open ended slots of the support bracket with the first and second fasteners; and
securing a first side panel to the support bracket with first and second protrusions of the support bracket, at the first side of the first enclosure, with a mounting surface of the first side panel facing an interior area of the first enclosure.

20. The method of claim 19, wherein securing the side panel to the support bracket includes aligning support holes formed in the side panel to receive studs extending as the first and second protrusions from the support bracket, to secure and support the first side panel relative to the first enclosure via the studs.

* * * * *